(12) United States Patent
Aggarwal

(10) Patent No.: US 9,939,732 B2
(45) Date of Patent: Apr. 10, 2018

(54) CONTROLLER FOR AN OPTICAL SYSTEM

(71) Applicant: Cymer, LLC, San Diego, CA (US)

(72) Inventor: Tanuj Aggarwal, San Diego, CA (US)

(73) Assignee: Cymer, LLC, San Diego, CA (US)

( * ) Notice: Subject to any disclaimer, the term of this patent is extended or adjusted under 35 U.S.C. 154(b) by 149 days.

(21) Appl. No.: 14/924,576

(22) Filed: Oct. 27, 2015

(65) Prior Publication Data

US 2017/0115575 A1   Apr. 27, 2017

(51) Int. Cl.
*G03B 27/54* (2006.01)
*G03F 7/20* (2006.01)

(52) U.S. Cl.
CPC ...... *G03F 7/70191* (2013.01); *G03F 7/70041* (2013.01); *G03F 7/70558* (2013.01)

(58) Field of Classification Search
CPC .............. G03F 7/70191; G03F 7/7041; G03F 7/70558; G03F 7/70041
USPC .......................................................... 355/67
See application file for complete search history.

(56) References Cited

U.S. PATENT DOCUMENTS

| | | |
|---|---|---|
| 5,321,718 A | 6/1994 | Waarts et al. |
| 6,133,986 A | 10/2000 | Johnson |
| 2002/0153868 A1 | 10/2002 | Takita |
| 2007/0006926 A1 | 1/2007 | Prakash et al. |
| 2008/0195359 A1 | 8/2008 | Barker et al. |
| 2015/0070673 A1 | 3/2015 | Lalovic et al. |

OTHER PUBLICATIONS

Blaine R. Copenheaver, U.S. International Searching Authority, International Search Report and Written Opinion, counterpart PCT Application No. PCT/US2016/057981, dated Jan. 10, 2017, 16 pages total.
Alfran et al., "Simulated Annealing," captured Aug. 26, 2014 from http://en.wikipedia.org/w/index.php?oldid=620107308, 8 pages.
Bertsimas et al., "Simulated Annealing," Statistical Science, 1993, vol. 8, No. 1, pp. 10-15.

*Primary Examiner* — Peter B Kim
(74) *Attorney, Agent, or Firm* — DiBeradino McGovern IP Group LLC

(57) ABSTRACT

A lithography system includes an optical source configured to emit a pulsed light beam; a lithography apparatus including an optical system, the optical system being positioned to receive the pulsed light beam from the optical source at a first side of the optical system and to emit the pulsed light beam at a second side of the optical system; and a control system coupled to the optical source and the optical lithography apparatus, the control system configured to: receive an indication of an amount of energy in the pulsed light beam at the second side of the optical system, determine an energy error, access an initial control sequence, the initial control sequence being associated with the optical source, determine a second control sequence based on the determined energy error and the initial control sequence, and apply the second control sequence to the optical source.

34 Claims, 10 Drawing Sheets

CONTROLLER FOR AN OPTICAL SYSTEM

TECHNICAL FIELD

The disclosed subject matter relates a controller for an optical system.

BACKGROUND

Photolithography is the process by which semiconductor circuitry is patterned on a substrate such as a silicon wafer. A photolithography optical source provides the deep ultraviolet (DUV) light used to expose a photoresist on the wafer. DUV light for photolithography is generated by excimer optical sources. Often, the optical source is a laser source and the pulsed light beam is a pulsed laser beam. The light beam is passed through a beam delivery unit, a reticle or a mask, and then projected onto a prepared silicon wafer. In this way, a chip design is patterned onto a photoresist that is then etched and cleaned, and then the process repeats.

SUMMARY

In one general aspect, a lithography system includes an optical source configured to emit a pulsed light beam; a lithography apparatus including an optical system, the optical system being positioned to receive the pulsed light beam from the optical source at a first side of the optical system and to emit the pulsed light beam at a second side of the optical system; and a control system coupled to the optical source and the optical lithography apparatus, the control system configured to: receive an indication of an amount of energy in the pulsed light beam at the second side of the optical system, determine an energy error, the energy error being based on the received indication of the amount of energy, access an initial control sequence, the initial control sequence being associated with the optical source, determine a second control sequence based on the determined energy error and the initial control sequence, and apply the second control sequence to the optical source.

Implementations may include one or more of the following features. The control system may be further configured to access a target energy and a previous control sequence. The control system being configured to determine an energy error may include the control system being configured to determine the energy error from the received indication of the amount of energy and an expected energy, the expected energy being based on the accessed target energy and at least one value from the previous control sequence. The previous control sequence may include a control sequence that was applied to the optical source prior to the determination of the second control sequence. The previous control sequence may include at least one predetermined value that was not applied to the optical source prior to the determination of the second control sequence. The target energy may be an energy in the pulsed light beam at the second side of the optical system when no disturbances are present in the optical source or the optical system.

The optical source may include a laser. The optical source may include a two-stage laser system, the two-stage laser system including a master oscillator and a power amplifier.

The optical source may include discharge electrodes, the second control sequence may include at least one value representing a voltage, and the control system being configured to apply the second control sequence to the optical source may include the control system being configured to apply the at least one value representing a voltage to the discharge electrodes.

The control system may include one or more electronic processors, and a non-transitory, computer-readable storage medium coupled to one or more of the one or more electronic processors, the computer-readable storage medium having stored thereon instructions, which, when executed by the one or more electronic processors, causes the one or more processors to perform operations.

In another general aspect, a method includes accessing an indication of an amount of energy in a pulsed light beam at a second side of an optical system, the pulsed light beam being produced by an optical source on a first side of the optical system; determining an energy error, the energy error being based on the received indication of the amount of energy; determining a second control sequence based on the determined energy error and an initial control sequence, the initial control sequence being associated with the optical source; and applying the second control sequence to the optical source.

Implementations may include one or more of the following features. Determining an energy error based on the received indication of the amount of energy may include determining the energy error from the received indication of the amount of energy and an expected energy, the expected energy being based on a target energy and at least one value from a previous control sequence. The previous control sequence may include a control sequence applied to the optical source prior to determining the second control sequence. The previous control sequence may include at least one predetermined value that was not applied to the optical source prior to the determination of the second control sequence.

Applying the second control sequence to the optical source may reduce a dose error, the dose error being based on a difference between the target energy and the received indication of the amount of energy.

Applying the second control sequence to the optical source may reduce one or more of a dose error and a control metric, the dose error being based on a difference between the target energy and the received indication of the amount of energy and the control metric being based on a variation of values in a control sequence applied to the optical source.

Some implementations also may include accessing a second indication of an amount of energy at the second side of the optical system; determining a second energy error based on the second indication of the amount of energy and an expected energy, the expected energy including at least one value of the second control sequence and a target energy; determining a third control sequence based on the determined second energy error and an initial control sequence; and applying the third control sequence to the optical source. The second control sequence may be applied to the optical source prior to the optical source producing a first pulse, and the third control sequence may be applied to the optical source prior to the optical source producing a second pulse, the first and second pulses being any two sequential pulses of the pulsed light beam.

The initial control sequence may be determined by accessing a model associated with the optical source; determining a modeled dose error based on the accessed model, the modeled dose error including N values; determining a candidate control sequence, the candidate control sequence including M values; determining a value of an energy metric, the value of the energy metric being associated with a variation of the N values of the modelled dose error;

determining a value of a control metric, the value of the control metric being associated with a variation of the M values of the candidate control sequence; and determining an initial value of a cost metric, the cost metric being based on the value of the value of the energy metric and the value of the control metric.

In another general aspect, a lithography system includes an optical source configured to emit a pulsed light beam including a plurality of pulses of light; a lithography apparatus including an optical system, the optical system being positioned to receive the pulsed light beam from the optical source at a first side of the optical system and to emit the pulsed light beam at a second side of the optical system; and a control system coupled to the optical source and the optical lithography apparatus, the control system including: a plurality of controllers, each controller associated with a sequence of gain values, a lower limit value, and an upper limit value; and one or more electronic processors and a non-transitory, computer-readable storage medium coupled to the one or more electronic processors, the computer-readable storage medium having stored thereon instructions, which, when executed by the one or more electronic processors, causes the one or more processors to: receive an indication of an amount of energy in a subset of pulses of the pulsed light beam at the second side of the optical system, determine an energy error based on the received indication of the amount of energy in the subset of pulses, determine an energy metric related to the determined energy error, access a previously generated control sequence stored in the computer-readable storage medium, generate a plurality of control sequences related to the determined energy error and a sequence of gain values associated with each controller from the plurality of controllers and accessed previously selected control sequence, select a control sequence from the generated plurality of control sequences by comparing each control sequence to the upper limit value and the lower limit value, and apply the selected control sequence to the optical source to reduce the energy metric.

Implementations may include one or more of the following features. The lithography system also may include a wafer holder configured to receive a wafer positioned on the second side of the optical system, where the received indication of the amount of energy in the pulses of the pulsed light beam at the second side of the optical system includes an indication of the amount of energy in the pulses of the pulsed light beam at the wafer holder.

In another general aspect, a method of controlling an optical lithography system includes receiving an indication of an amount of energy in a plurality of pulses of light, the plurality of pulses of light being a subset of pulses in a pulsed light beam emitted from an optical source; determining an energy metric based on the received indication, the energy metric representing a measured amount of energy in the subset of pulses; comparing the determined energy metric to a reference energy value; determining an energy error based on the comparison; determining a plurality of control sequences from the energy error, each of the plurality of control sequences being determined based on a gain value and the energy error; comparing the determined control sequences to a control limit; and selecting a control sequence that is within the control limit from among the determined plurality of control sequences.

Implementations may include one or more of the following features. The control limit may include a plurality of control limits. Each of the determined control sequences may be compared to one of the plurality of control limits.

In another general aspect, a method includes accessing an energy error, the energy error being a predicted energy error associated with an optical source; accessing a model of the optical source; determining an estimated dose error based on the accessed energy error and the model of the optical source, the estimated dose error including a plurality of values; accessing first candidate control sequence, the first candidate control sequence including a plurality of values; determining a value of an energy metric based on the values of the estimated dose error; determining a first value of a control metric based on the values of the first candidate control sequence; determining a first value of a cost metric based on the value of the energy metric and the first value of the control metric; accessing a second candidate control sequence, the second candidate control sequence including a plurality of values; determining a second value of the control metric based on the values of the second candidate control sequence; determining a second value of the cost metric based on the energy metric and the second value of the control metric; selecting the second candidate control sequence as a selected control sequence if the second value of the cost metric is less than the first value of the cost metric; and selecting the first candidate control sequence as the selected control sequence if the second value of the cost metric is equal to or greater than the first value of the cost metric.

Implementations may include one or more of the following features. A weighting factor may be accessed, and determining the first value of the cost metric and the second value of the cost metric may also be based on the weighting factor. The first value of the cost metric may be based on the weighting factor, and a sum of the first value of the control metric and the energy metric, and the second value of the cost metric may be based on the weighting factor, and a sum of the second value of the control metric and the energy metric.

The selected control sequence may be applied to the optical source.

Implementations of any of the techniques described above may include a method, a process, a device, executable instructions stored on a computer-readable medium, a controller that includes an electronic processor and a computer-readable medium, the controller being configured to control an optical source that produces bursts of pulses of light, or an apparatus. The details of one or more implementations are set forth in the accompanying drawings and the description below. Other features will be apparent from the description and drawings, and from the claims.

DRAWING DESCRIPTION

FIGS. 3A, 3B, and 3C are graphs of examples of signals that are used to control an optical source that is part of a photolithography system.

Figure 4:
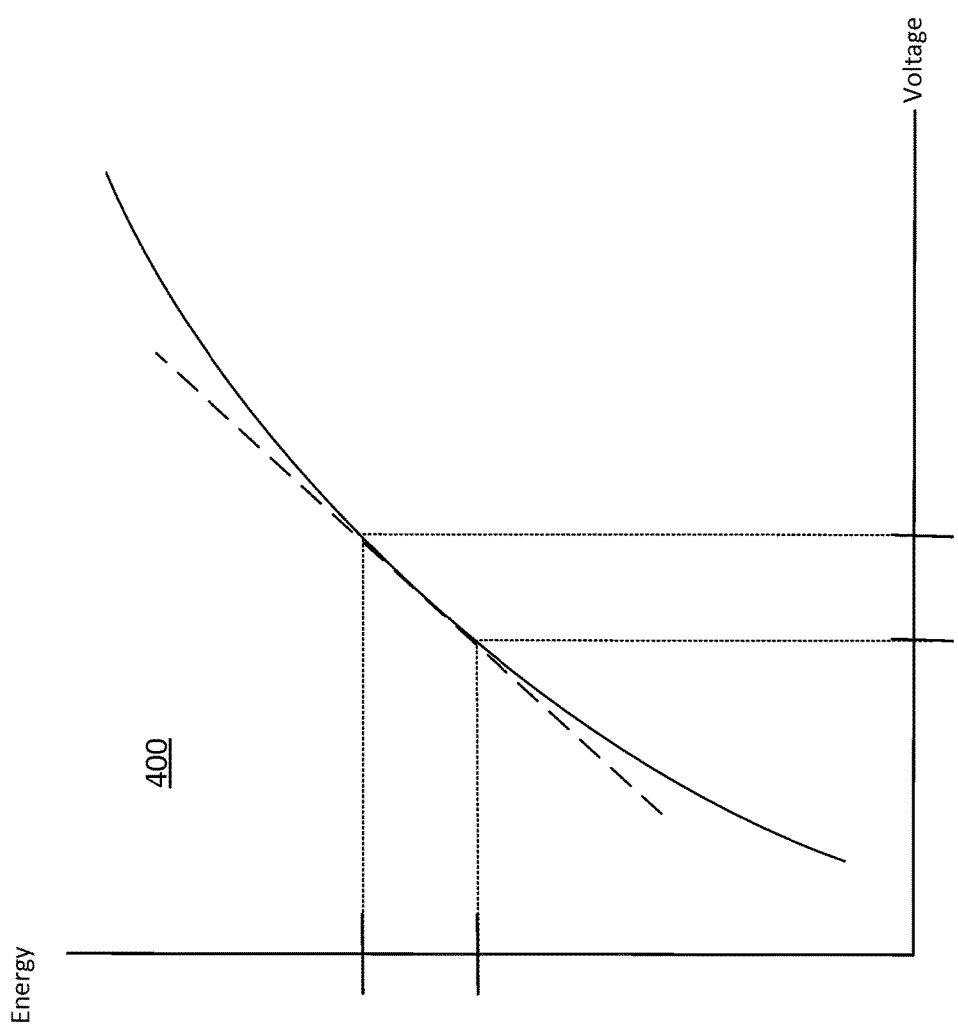

FIG. 4 is an example of a graph of energy versus voltage of an optical source, the graph showing the non-linear relationship between the energy and the voltage.

Figure 5:
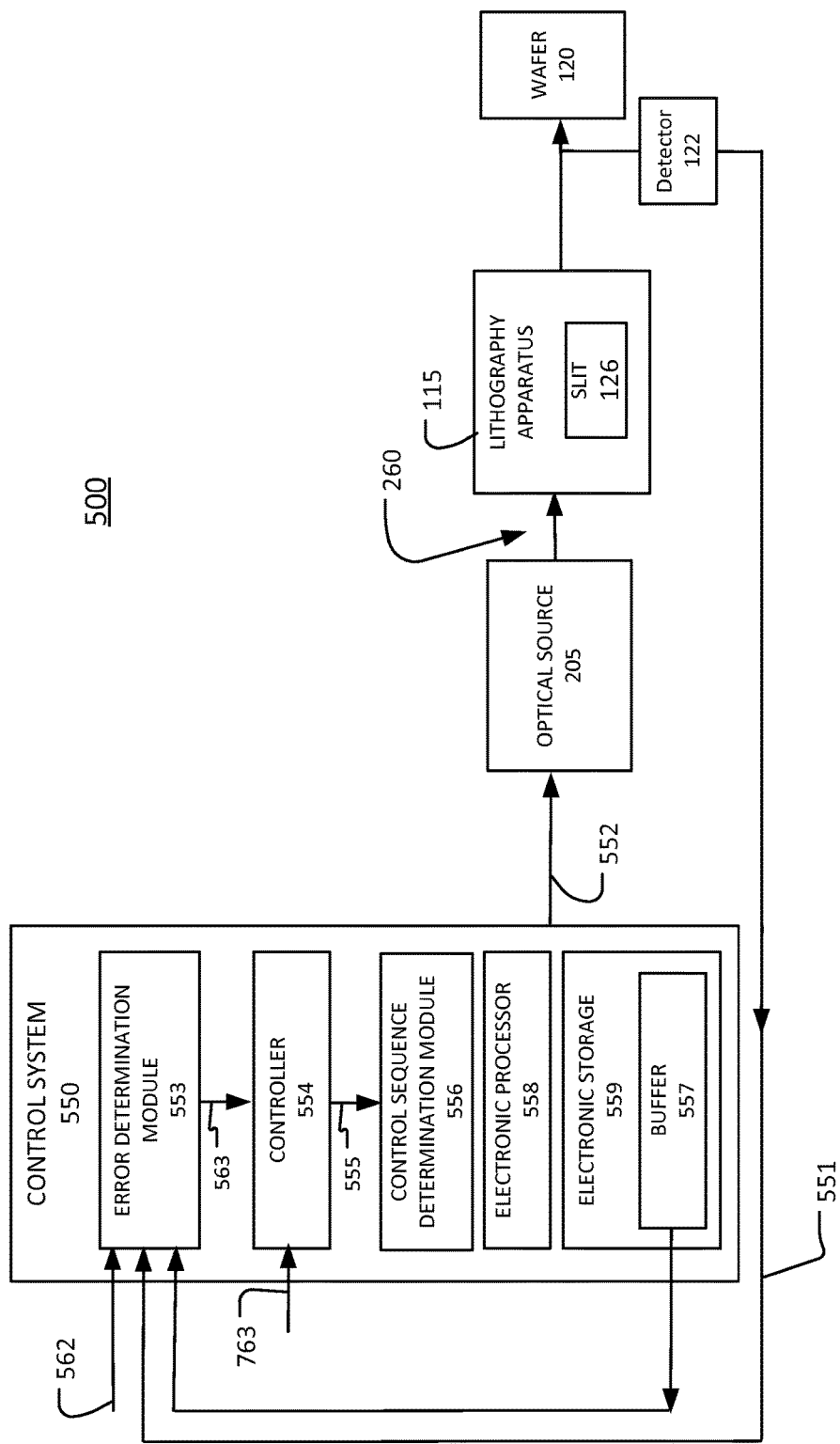

FIG. 5 is a block diagram of an example of a control system that can be used in a photolithography system such as the photolithography system of FIG. 1.

Figure 6:
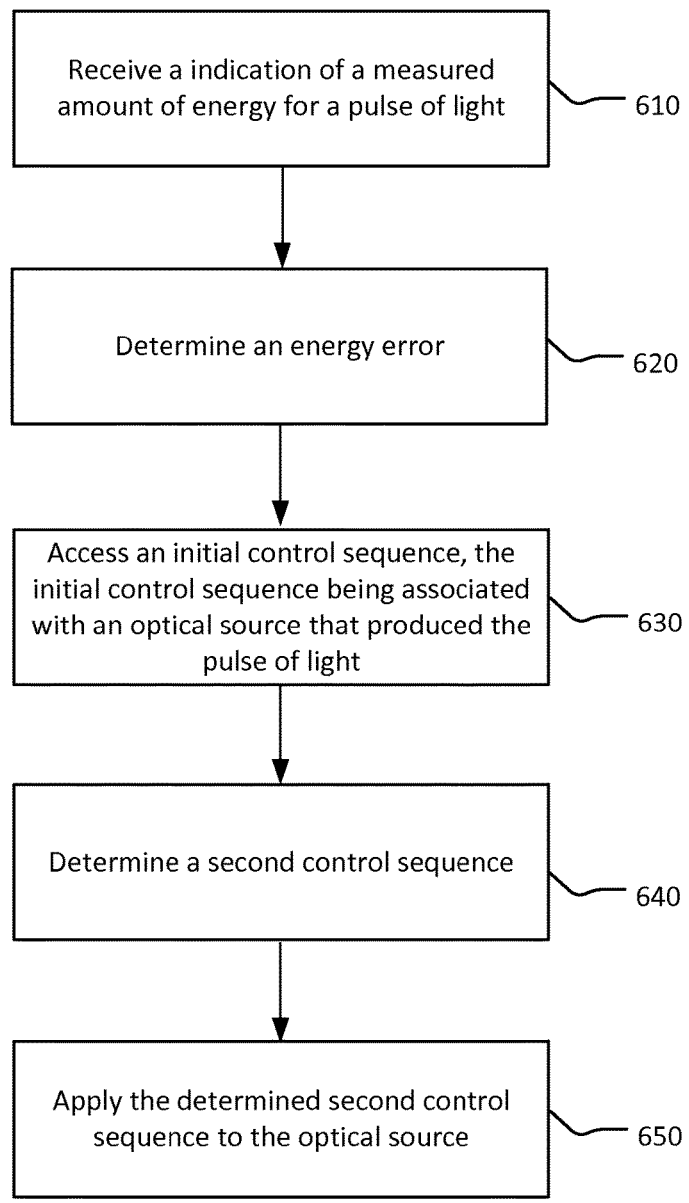

FIG. 6 is a flow chart of an exemplary process for controlling an optical source.

Figure 7:
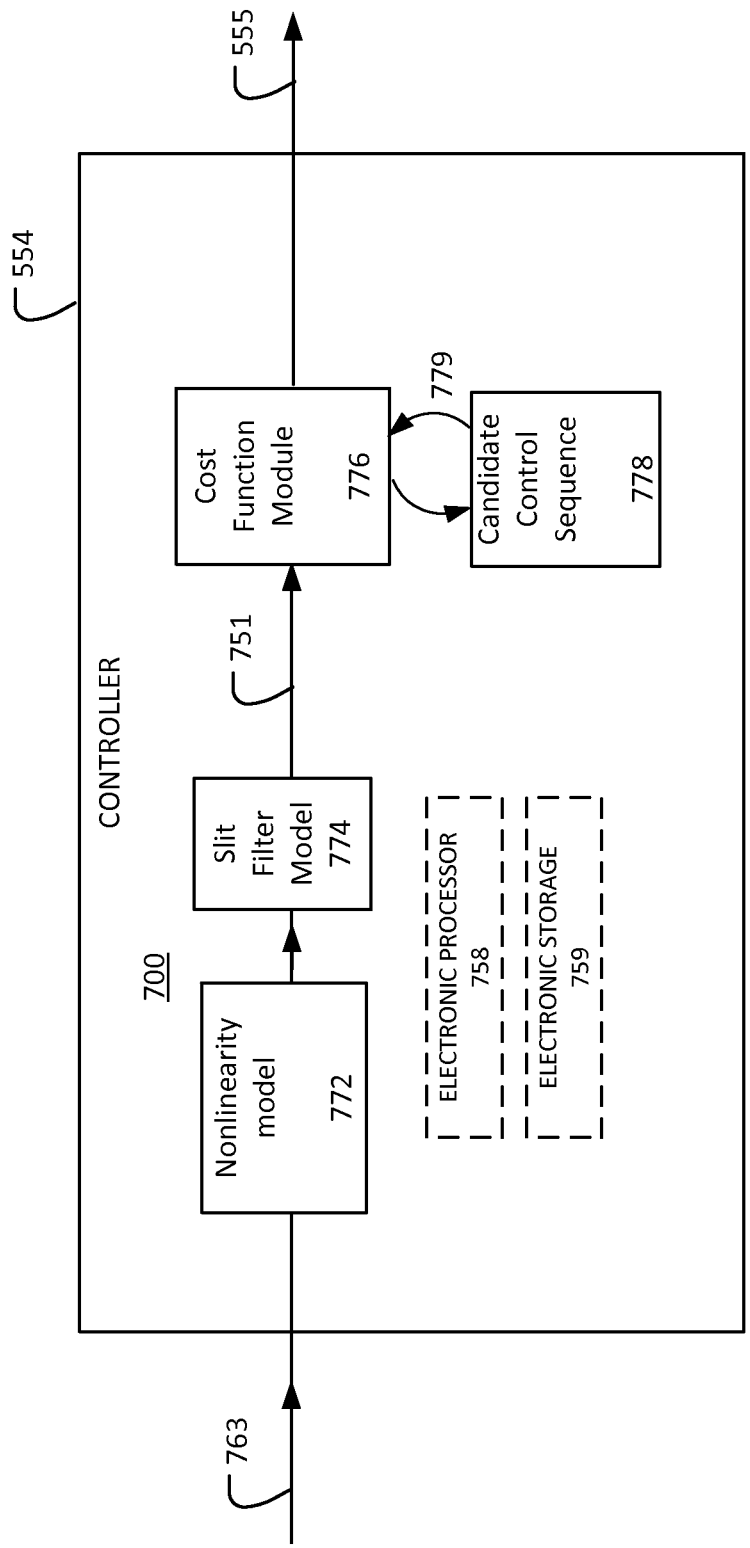

FIG. 7 is a block diagram of an example of a controller that can be used in the block diagram of FIG. 5.

Figure 8:
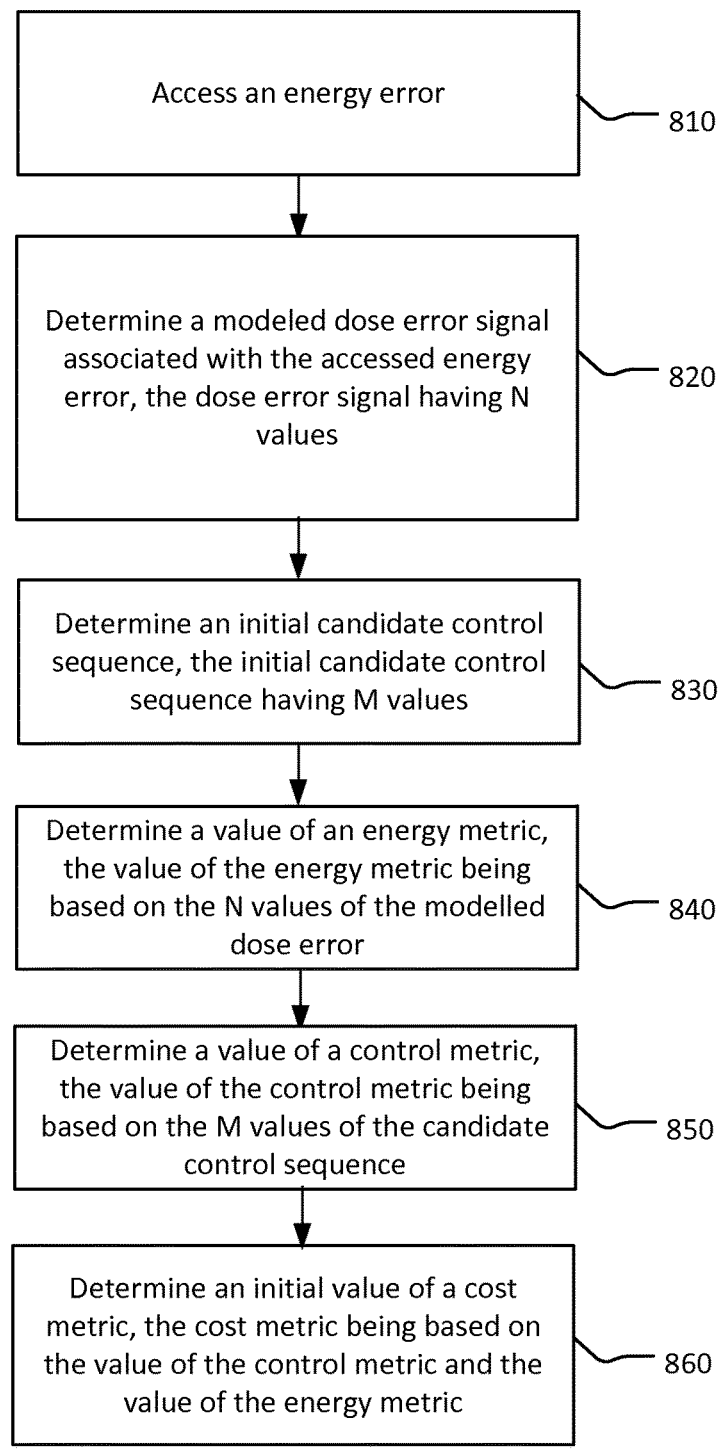

FIG. 8 is a flow chart of an example process for determining a control sequence.

Figure 9:
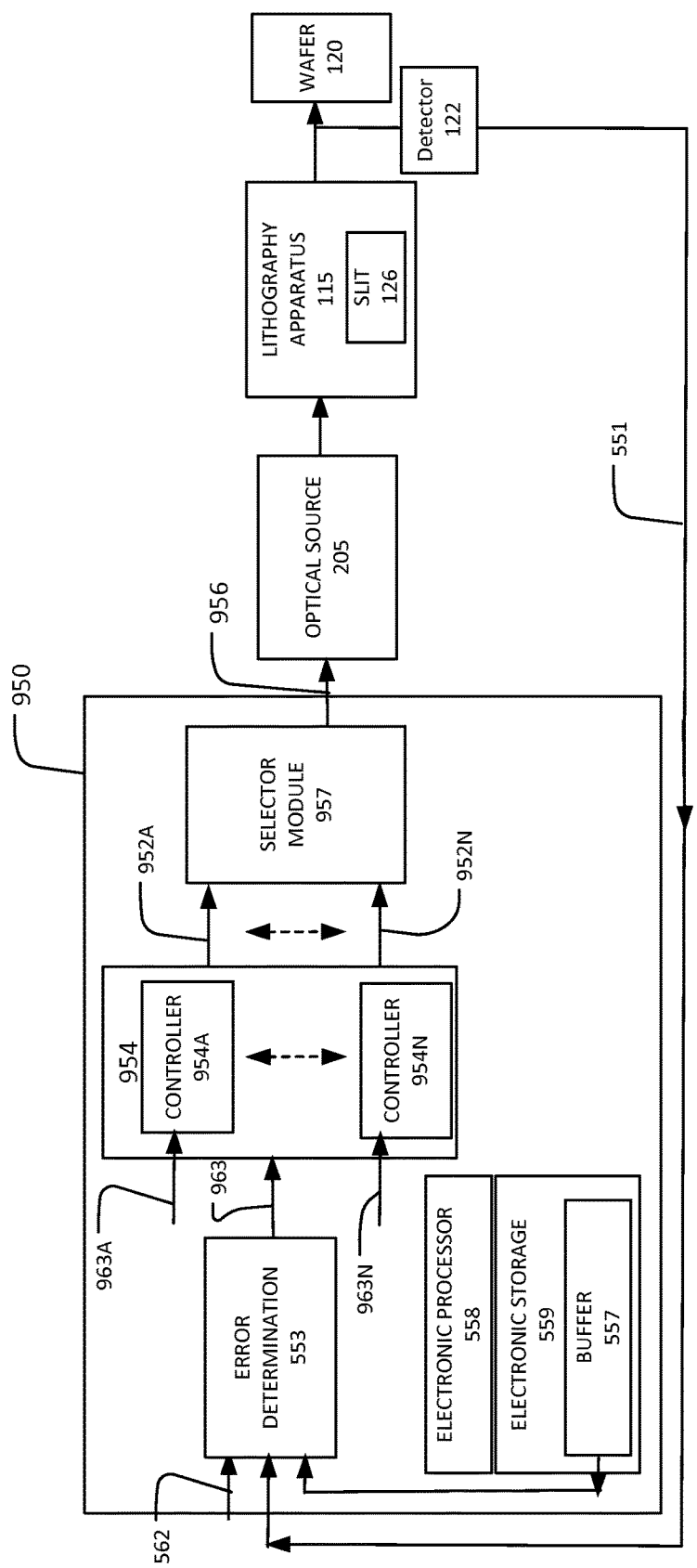

FIG. 9 is a block diagram of an example of a switchable control system that can be used in a photolithography system such as the photolithography system of FIG. 1.

Figure 10:
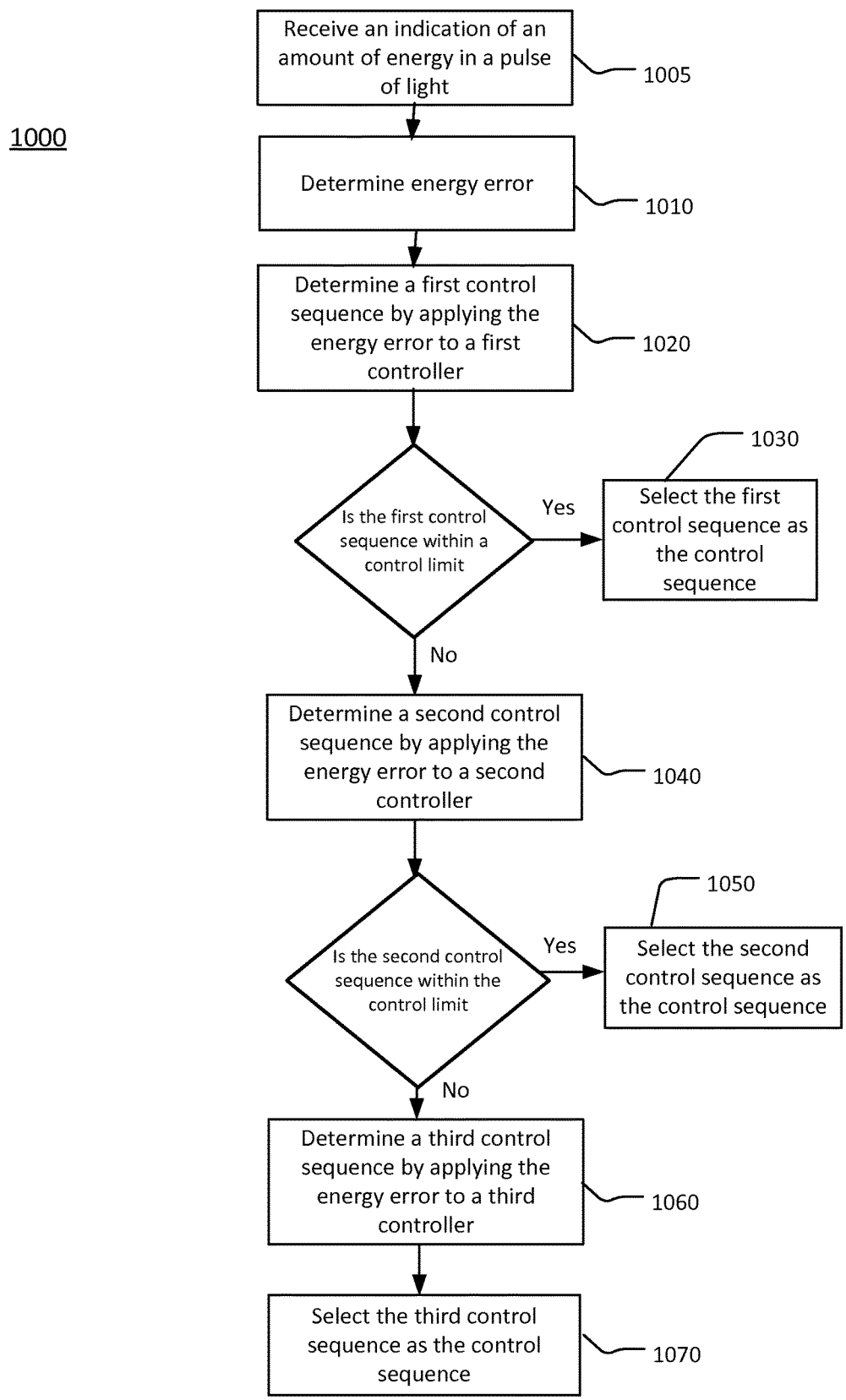

FIG. 10 is a flow chart of an exemplary process for controlling a selector module of the switchable control system of FIG. 9.

DETAILED DESCRIPTION

Figure 1B:
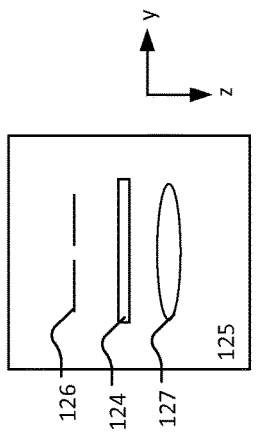
FIG. 1B is a block diagram of an example of a mask used in the photolithography system of FIG. 1A.
Figure 1A:
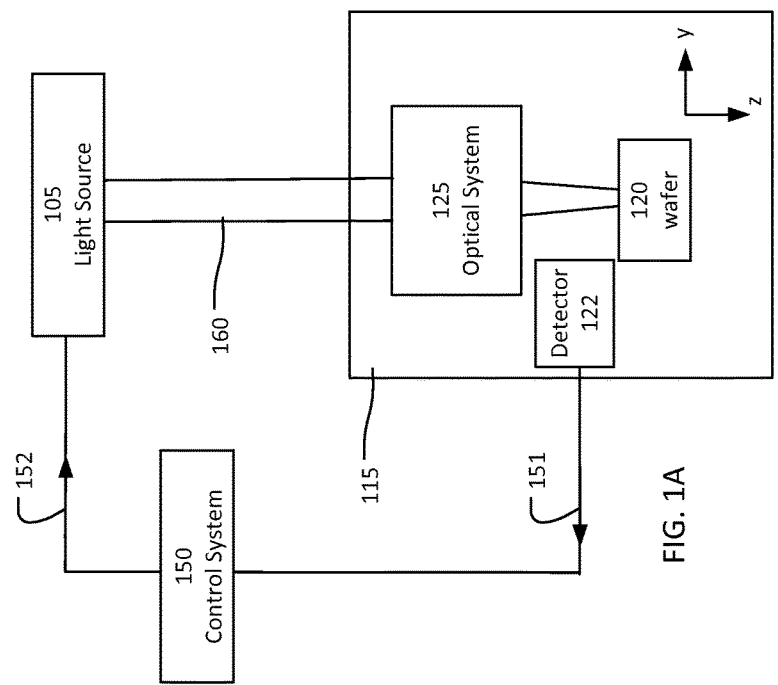
FIG. 1A is a block diagram of an example of a photolithography system.

Referring to FIG. 1A, a photolithography system 100 includes an optical (or light) source 105 that provides a light beam 160 to lithography exposure apparatus 115, which processes a wafer 120. The light beam 160 is a pulsed light beam that includes pulses of light separated from each other in time. The lithography exposure apparatus 115 includes a projection optical system 125 through which the light beam 160 passes prior to reaching the wafer 120. The photolithography system 100 also includes a control system 150. The control system 150 receives an indication of an amount of energy at the wafer 120 from a detector 122 and uses the indication to determine or select a control sequence 152 that, when applied to the source 105, controls the energy of the light beam 160.

Microelectronic features are formed on the wafer 120 by, for example, exposing a layer of radiation-sensitive photoresist material that is on the wafer 120 with the light beam 160. Referring also to FIG. 1B, the projection optical system 125 includes a slit 126, a mask 124, and a projection lens 127. After reaching the projection optical system 125, the light beam 160 passes through the slit 126. In the example of FIGS. 1A and 1B, the slit 126 is rectangular and shapes the light beam 160 into an elongated rectangular shaped light beam. This shaped light beam then passes through the mask 125. A pattern is formed on the mask 125, and the pattern determines which portions of the shaped light beam are transmitted by the mask 125 and which are blocked by the mask 125. The design of the pattern is determined by the specific microelectronic circuit design that is to be formed on the wafer 120. The portions of the shaped light beam that are transmitted by the mask 125 pass through (and can be focused by) the projection lens 127 and expose the wafer 120.

The amount of energy delivered to the wafer 120 by the light beam 160 per unit area over an exposure time (or a particular number of pulses of the light beam 160) is referred to as the dose or the exposure energy (for example, in units of Joules). The formation of the micro-electronic features on the wafer 120 depends on the proper dose (a "target dose") reaching the wafer 120. If too little energy reaches the wafer 120 over the exposure time (the dose is too low and is less than the target dose), the radiation-sensitive material of the wafer 120 is not activated and the micro-electronic features are not formed or are incompletely formed on the wafer 120. If too much energy reaches the wafer 120 over the exposure time (the dose is too high and is greater than the target dose), the radiation-sensitive material of the wafer 120 can be exposed outside of the bounds of the image of the slit pattern and the micro-electronic features are improperly formed on the wafer 120. Thus, minimization or reduction of dose error, which is a difference between the dose and the target dose, is important to the accurate and efficient performance of the photolithography system 100.

The dose error can be caused by variations in the amount of energy in the light beam 160, and these variations can arise from, for example, noise in the optical source 105 and/or disturbances that are internal or external to the optical source 105. A feedback controller can be used to minimize or reduce these effects; however, typical linear controllers may introduce instabilities into the photolithography system 100 that can increase the dose error. For example, a conventional aggressive (high gain) linear controller may be able to achieve reduced dose error, but at the cost of reduced stability by, for example, causing the controlled component of the optical source 105 to become saturated and thus less able to correct for dose error.

In a linear setting, a linear quadratic regulator/linear quadratic Gaussian (LQR/LQG) controller may be devised that reduces the dose error. However, because of nonlinearities present in the optical source 105, such a linear LQR/LQG controller could face challenges if used in the control system 150. Thus, the control system 150 employs a controller that minimizes or reduces a dose cost function, which is based on dose error and variations in a control sequence 152 configured for application to the optical source 105, in the presence of nonlinear system constraints. In the context of the photolithography system 100, the nonlinear system constraints are based on the nonlinearities in the optical source 105. In some implementations, the control system 150 includes a plurality of switched controllers, with each controller being designed with certain stability properties. For example, each controller of the plurality of controllers can be designed for a particular size of energy error or range of energy errors or gain margins. An example of this implementation is shown and discussed with respect to FIGS. 9 and 10.

As discussed in greater detail below, the control system 150 receives an indication 151 of an amount of energy from the detector 122. The indication 151 is a series of energy values measured by the detector 122, with each energy value representing an amount of energy at the wafer 120 at a particular time (for example, the energy at the wafer 120 delivered by a particular pulse of light or a series of pulses of light). The control system 150 applies a control sequence 152 to the optical source 105 to adjust the amount of energy in the beam 160. The control sequence 152 is a sequence of values, each of which, when applied to the optical source 105, adjusts the energy of one pulse of light emitted from the optical source 105. The control sequence 152 is determined or selected based on a controller that is designed based on the characteristics of the optical source 105 and can be considered to be an optimized controller. The controller is derived from a cost function that minimizes or reduces the variation of the values of the control sequence that is applied to the optical source 105 and/or the variation of the amount of energy that is delivered to the wafer 120. In other words, the control system 150 minimizes or reduces the dose error while also maximizing or improving the stability of the optical source 105. In this way, the control system 150 improves the performance of the photolithography system 100.

Figure 2:
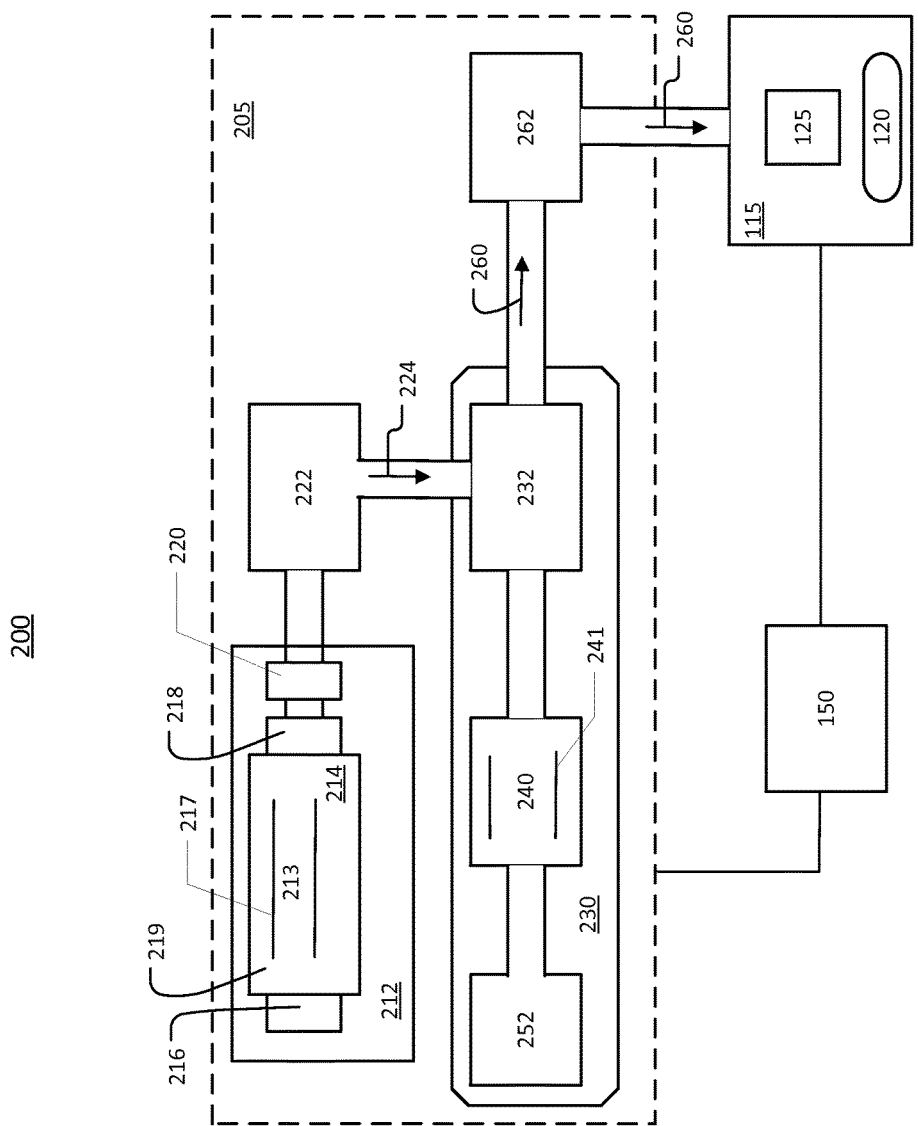
FIG. 2 is a block diagram of another exemplary photolithography system.

Referring also to FIG. 2, a block diagram of an exemplary photolithography system 200 is shown. In the photolithography system 200, an exemplary optical source 205 is used as the optical source 105 (FIG. 1). The optical source 205 produces a pulsed light beam 260, which is provided to the lithography exposure apparatus 115. The optical source 205 can be, for example, an excimer optical source that outputs the pulsed light beam 260 (which can be a laser beam). As the pulsed light beam 260 enters the lithography exposure apparatus 115, it is directed through the projection optical system 125 and projected onto the wafer 120. In this way, one or more microelectronic features are patterned onto a photoresist on the wafer 120 that is then etched and cleaned, and the process repeats.

The photolithography system 200 also includes the control system 150, which, in the example of FIG. 2, is connected to components of the optical source 205 as well as to the lithography exposure apparatus 115 to control various operations of the system 200. The control system 150 interacts with the optical source 205 so that the dose delivered to the wafer 120 is maintained within an error bound.

In the example shown in FIG. 2, the optical source 205 is a two-stage laser system that includes a master oscillator (MO) 212 that provides a seed light beam 224 to a power amplifier (PA) 230. The power amplifier 230 receives the seed light beam 224 from the master oscillator 212 and amplifies the seed light beam 224 to generate the light beam 260 for use in the lithography exposure apparatus 115. For example, the master oscillator 212 can emit a pulsed seed light beam, with seed pulse energies of approximately 1 milliJoule (mJ) per pulse, and these seed pulses can be amplified by the power amplifier 230 to about 10 to 15 mJ.

The master oscillator 212 includes a discharge chamber 214 having two elongated electrodes 217, a gain medium 219 that is a gas mixture, and a fan for circulating gas between the electrodes 217. A resonator is formed between a line narrowing module 216 on one side of the discharge chamber 214 and an output coupler 218 on a second side of the discharge chamber 214. The line narrowing module 216 can include a diffractive optic such as a grating that finely tunes the spectral output of the discharge chamber 214. The master oscillator 212 also includes a line center analysis module 220 that receives an output light beam from the output coupler 218 and a beam modification optical system 222 that modifies the size or shape of the output light beam as needed to form the seed light beam 224. The line center analysis module 220 is a measurement system that can be used to measure or monitor the wavelength of the seed light beam 224. The line center analysis module 220 can be placed at other locations in the optical source 205, or it can be placed at the output of the optical source 205.

The gas mixture used in the discharge chamber 214 can be any gas suitable for producing a light beam at the wavelength and bandwidth required for the application. For example, for an excimer source, the gas mixture can contains a noble gas (rare gas) such as, for example, argon or krypton, a halogen, such as, for example, fluorine or chlorine and traces of xenon apart from helium and/or neon as buffer gas. Specific examples of the gas mixture include argon fluoride (ArF), which emits light at a wavelength of about 193 nm, krypton fluoride (KrF), which emits light at a wavelength of about 248 nm, or xenon chloride (XeCl), which emits light at a wavelength of about 351 nm. The excimer gain medium (the gas mixture) is pumped with short (for example, nanosecond) current pulses in a high-voltage electric discharge by application of a voltage to the elongated electrodes 217.

The power amplifier 230 includes a beam modification optical system 232 that receives the seed light beam 224 from the master oscillator 212 and directs the light beam through a discharge chamber 240, and to a beam turning optical element 252, which modifies or changes the direction of the seed light beam 224 so that it is sent back into the discharge chamber 240. The discharge chamber 240 includes a pair of elongated electrodes 241, a gain medium 219 that is a gas mixture, and a fan for circulating the gas mixture between the electrodes 241.

The output light beam 260 is directed through a bandwidth analysis module 262, where various parameters (such as the bandwidth or the wavelength) of the beam 260 can be measured. The output light beam 260 can also be directed through a pulse stretcher, where each of the pulses of the output light beam 260 is stretched in time, for example, in an optical delay unit, to adjust for performance properties of the light beam that impinges the lithography exposure apparatus 115.

The control system 150 may be connected to various components of the optical source 205. For example, the control system 150 may control when the optical source 205 emits a pulse of light or a burst of light pulses that includes one or more pulses of light by sending one or more signals to the optical source 205. The light beam 260 can include one or more bursts that are separated from each other in time. Each burst can include one or more pulses of light. In some implementations, a burst includes hundreds of pulses, for example, 100-400 pulses.

Figure 3:
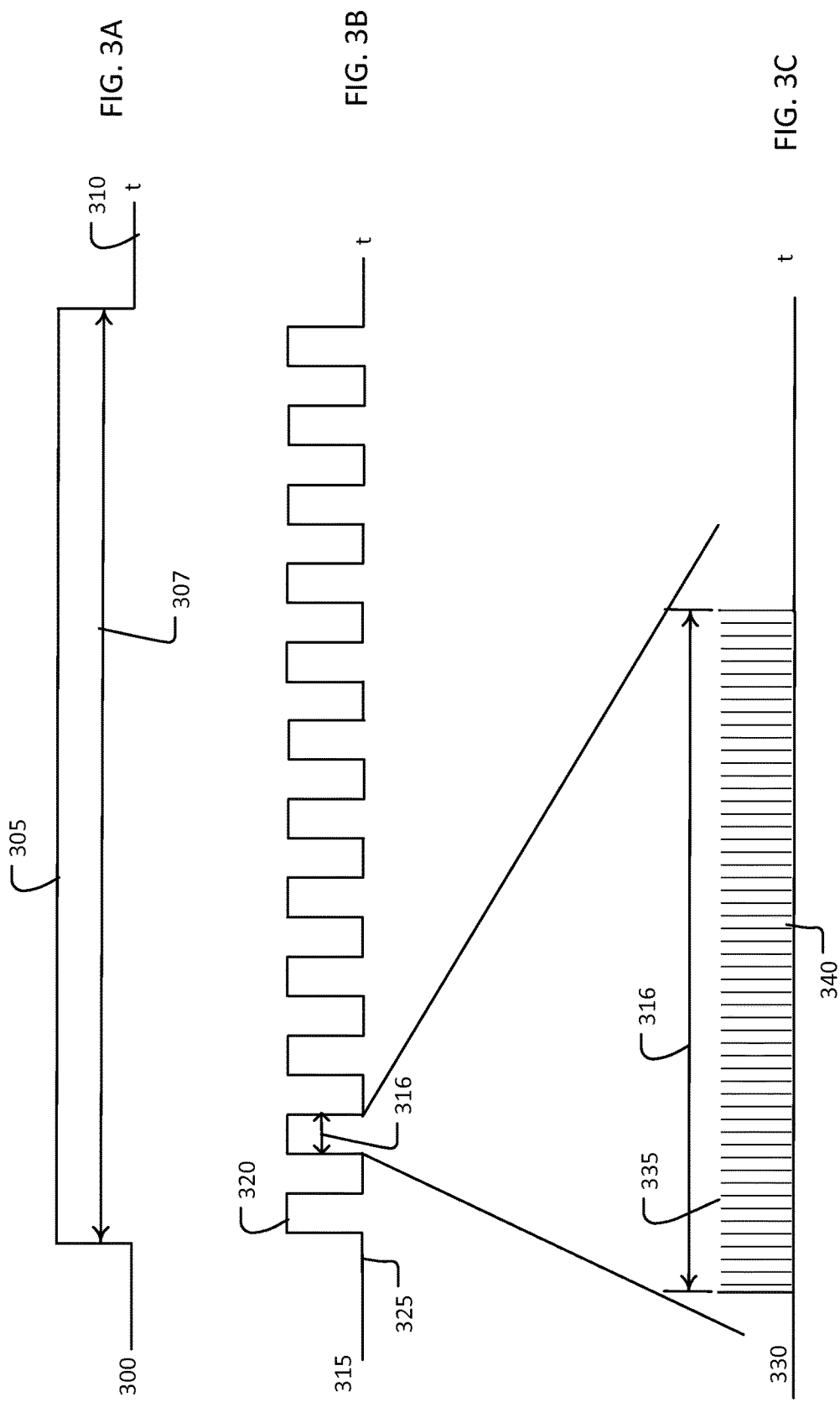

Referring also to FIG. 3, a set of graphs showing a control scheme representing wafer exposure time, bursts of pulses, and pulses is shown. FIG. 3A shows amplitude of a wafer exposure signal 300 as a function of time, FIG. 3B shows an amplitude of a gate signal 315 as a function of time, and FIG. 3C shows an amplitude of a trigger signal as a function of time.

The control system 150 can be configured to send a wafer exposure signal 300 to the optical source 205 to control the optical source 205 to produce the light beam 260. In the example shown in FIG. 3A, the wafer exposure signal 300 has a high value 305 (for example, 1) for a period of time 307 during which the optical source 205 produces bursts of pulses of light. The wafer exposure signal 300 otherwise has a low value 310 (for example, 0) when the wafer 120 is not being exposed.

Referring to FIG. 3B, the light beam 260 is a pulsed light beam, and the light beam 260 includes bursts of pulses. The control system 150 also controls the duration and frequency of the bursts of pulses by sending a gate signal 315 to the optical source 205. The gate signal 315 has a high value 320 (for example, 1) during a burst of pulses and a low value 325 (for example, 0) during the time between successive bursts. In the example shown, the duration of time at which the gate signal 315 has the high value is also the duration of a burst 316.

Referring to FIG. 3C, the control system 150 also controls the repetition rate of the pulses within each burst with a trigger signal 330. The trigger signal 330 includes triggers 340, one of which is provided to the optical source 205 to cause the optical source 205 to produce a pulse of light. The control system 150 can send a trigger 340 to the source 205 each time a pulse is to be produced. Thus, the repetition rate of the pulses produced by the optical source 205 (the time between two successive pulses) can be set by the trigger signal 330.

As discussed above, when the gain medium 219 is pumped by applying voltage to the electrodes 217, the gain medium 219 emits light. When voltage is applied to the electrodes 217 in pulses, the light emitted from the medium 219 is also pulsed. Thus, the repetition rate of the pulsed light beam 260 is determined by the rate at which voltage is applied to the electrodes 217, with each application of voltage producing a pulse of light. The pulse of light propagates through the gain medium 219 and exits the chamber 214 through the output coupler 218. Thus, a train of pulses is created by periodic, repeated application of voltage to the electrodes 217. The trigger signal 330, for example, can be used to control the application of voltage to the electrodes 217 and the repetition rate of the pulses, which can range between about 500 and 6,000 Hz for most applications. In some implementations, the repetition rate can be greater than 6,000 Hz, and can be, for example, 12,000 Hz or greater The signals from the control system 150 can also be used to control the electrodes 217, 241 within the master oscillator 212 and the power amplifier 230, respectively, for controlling the respective pulse energies of the master oscillator 212 and the power amplifier 230, and thus, the energy of the light beam 260. The repetitively-pulsed light beam 260 can have an average output power in the range of tens of watts, for example, from about 50 W to about 130 W. The irradiance (that is, the average power per unit area) of the light beam 260 at the output can range from 60 W/cm$^2$ to 80 W/cm$^2$ The amount of energy (in Joules) in a pulse produced by the optical source 205 can vary from the expected amount, leading to dose error. The amount of energy produced by the optical source 205 can be adjusted by changing the amount of voltage applied to the electrodes 217 and/or the electrodes 241. The relationship between the amount of energy in a pulse produced by the optical source and the voltage applied to the electrodes 217 and/or the electrodes 241 is nonlinear. Referring also to FIG. 4, a graph 400 shows an exemplary relationship between energy (in arbitrary units) produced by the optical source 205 on the vertical (y) axis as a function of applied voltage (in arbitrary units) on the horizontal (x) axis. The relationship between produced energy and applied voltage is nonlinear.

As discussed above, the control system 150 provides a control sequence 152 to the optical source 205 to control the amount of energy that the optical source 205 produces in a pulse of light. The control sequence 152 includes a plurality of values, and can include a voltage of a particular value for each pulse that is produced by the optical source 205. The control system 150 can adjust the amount of energy produced by the optical source 205 through the control sequence 152. As discussed below, the control sequence 152 is determined or selected to minimize or reduce the effects of the nonlinearities in the optical source 205 while also minimizing or reducing the dose error.

Referring to FIG. 5, an exemplary photolithography system includes the optical source 205 (FIG. 2) that generates the pulsed light beam 260, which is provided to the wafer 120 (FIG. 1) through the lithography exposure apparatus 115. The detector 122 measures an amount of energy that is received at the wafer 120 and provides an indication 551 of the measured amount of energy to a control system 550. The control system 550 generates a control sequence 552 that is applied to the optical source 205 to adjust the energy of the light produced by the optical source 205, minimizing or reducing the dose error of light that reaches the wafer 120.

The control sequence 552 is a value or a sequence of values that, when applied to the optical source 205, changes the amount of energy in a pulse or pulses of light produced by the optical source 205. The control sequence 552 can be a vector of M values, with each of the values representing a value of a signal (for example, an amount of voltage) that is applied to the optical source 205 prior to the production of a pulse of light in the light beam 260. In other words, each of the M values may be a value that is used to control the optical source 205 in the production of a single pulse of light. Even though the control sequence 522 is applied to the optical source 205 prior to the production of a pulse, the M values in an instance of the control sequence 522 may be used to control the optical source 205 to produce the next pulse and the following M−1 pulses of light. Characteristics (such as energy) of the pulse are determined in part by the value of the signal in the control sequence 552. As discussed below, the values in the control sequence 552 may be determined and updated on an ongoing basis to allow for pulse-to-pulse control of the optical source 205.

The control system 550 includes an error determination module 553, a controller 554, a control sequence determination module 556, an electronic processor 558, and an electronic storage 559. The electronic processor 558 is one or more processors suitable for the execution of a computer program such as a general or special purpose microprocessor, and any one or more processors of any kind of digital computer. Generally, a processor receives instructions and data from a read-only memory or a random access memory or both. The electronic processor 558 can be any type of electronic processor. The electronic storage 559 can be volatile memory, such as RAM, or non-volatile memory. In some implementations, the electronic storage 559 can include both non-volatile and volatile portions or components. The electronic storage 559 stores instructions, perhaps as a computer program, that, when executed, cause the processor 558 to communicate with other components in the control system 550.

The control system 500 also can include a buffer 557 that stores the control sequence 552. In the example of FIG. 5, the buffer 557 is part of the electronic storage 559. In other implementations, the buffer 557 can be a separate memory module that is not part of the electronic storage 559. The buffer 557 stores one or more instances of the control sequence 552, with an instance of the control sequence being a particular set of M values. The values in the control sequence 552 are updated and/or changed during operation of the light source 205. Thus, each of the various instances of the control sequence 552 include M number of values, though the values themselves can vary among instances. By storing one or more instances of the control sequence 552, one or more values of an instance of the control sequence 552 that is associated with a previous (or earlier occurring) pulse of light can be used to determine one or more of the values of an instance of a control sequence 552 for a later occurring pulses of light. In some implementations, the buffer 557 has M values or less and stores the current instance of the control sequence 522 by removing values from the buffer that are associated with previous pulses, shifting the remaining values, and inserting updated values into the buffer 557. In some implementations, the values of the control sequence 552 are updated for each pulse of light produced by the optical source 205. In other words, in these implementations, an instance of the control sequence 552 is determined prior to the production of each pulse of light, allowing pulse-to-pulse control of the optical source 205.

As discussed below, the control system 550 determines an energy error 563 from data provided by the detector 122 (via the indication 551), a target energy value 562, and a value from a previous instance of the control sequence 552. For example, the value from the previous instance of the control sequence 552 can be a value of the control sequence 552 associated with the immediately preceding pulse of light. In other words, the value from the previous instance of the control sequence 552 can be a value that was provided to the optical source 205 to produce the light pulse that was produced immediately before the current light pulse. If a value of a previous instance of the control sequence 552 is not known, such as, for example, when the current light pulse is the first light pulse produced by the optical source 205, a user-supplied or pre-determined value (such as, for example, 0) can be used as the value from the previous instance of the control sequence 552.

The controller 554 determines an initial control sequence 555, which is optimized, tailored, or otherwise designed for the optical source 205 as discussed further with respect to FIGS. 7 and 8. An instance of the control sequence 552 for application to the optical source 205 is determined from the initial control sequence 555, the determined energy error 563, and a value from a previous instance of the control sequence 552. The determined control sequence 552 is then applied to the optical source 205.

Referring also to FIG. 6, a flow chart of an exemplary process 600 for reducing or minimizing the dose error is shown. The process 600 can be performed by the electronic processor 558, and the process 600 is discussed with reference to the photolithography system 500.

The indication 551 of a measured amount of energy for a pulse of light is received (610). The detector 122 senses the beam 260 at the surface of the wafer 120 and provides the indication 551 of the amount of energy at the surface of the wafer 120 to the control system 550. The indication 551 can include a numerical value that indicates an amount of energy in a single pulse of the light beam 560 at the wafer 120, a series of numerical values that indicate the amount of energy in a plurality of pulses of the light beam 560 that reach the wafer 120, or an average amount of energy in a plurality of pulses of the light beam 560 at the wafer 120.

The energy error 563 is determined (620). The energy error 563 is determined from the indication 551 and an expected energy, which is the sum of a target energy 562 and a value from a previous instance of the control sequence 552. The value of the previous instance of the control sequence 552 can be the value of the control sequence 552 provided to the optical source 205 to produce the immediately preceding pulse of light. The target energy 562 is the amount of energy that a pulse of the beam 560 delivers to the wafer 120 under ideal or optimal conditions, that is, when no disturbances are present and no dose error occurs.

The target energy 562 can vary depending on the application and the type of features that are being patterned on the wafer 120. The energy error 563 is the difference between the amount of energy that actually reaches the wafer 120 and the expected energy. Thus, the energy error 563 is the difference between the expected energy and the indication 551 for a particular pulse of light. The energy error 563 can vary on a pulse-to-pulse basis. In other words, one pulse of light that reaches the wafer 120 may have a different energy error than the next pulse that reaches the wafer 120. The target energy 562 can be a value or values that are stored on the electronic storage 559, or the target energy 562 can be provided to the control system 550 by an operator or an automated process.

The initial control sequence 555 is accessed (630). The initial control sequence 555 is a control sequence applied to the optical source 205 in response to a unit of energy error and is designed to minimize the dose error of the lithography system resulting from the unit of energy error. The unit of energy error is the assumed energy error that is used when designing or determining the initial control sequence 555. The unit of energy error can be, for example 1 mJ or 1 J, or any other pre-determined value depending on the application. The initial control sequence 555 is optimized, tailored, or otherwise designed for the optical source 205 and/or the lithography exposure apparatus 115. The initial control sequence 555 is a control sequence that minimizes a cost function that depends on the variance of the dose error (the integrated energy reading at the wafer 120) resulting from a pre-determined energy error and/or the variance of the control sequence 552. In other words, the initial control sequence 555 is a control sequence that minimizes dose error while also minimizing the control effort and accounting for constraints that are particular to the lithography system 500.

The initial control sequence 555 can be accessed from the electronic storage 559 or the controller 554. In some implementations, the initial control sequence 555 is determined by the control system 550 and the controller 554 while the lithography system 500 is operating. Alternatively, the initial control sequence 555 can be provided to the control system 550 as an electronic input.

Referring also to FIG. 7, a block diagram of an example implementation of the controller 554 is shown. The controller 554 determines the initial control sequence 555 based on a pre-determined energy error 763. The pre-determined energy error 763 represents an amount by which the energy at the wafer 120 is assumed or expected to differ (greater or less) than the target energy for the application. The controller 554 makes or constructs a descriptive or representational model 700 of the photolithography system 500 and uses the model 700 to determine or estimate a dose error signal 751 (an integrated amount of energy error) present at the wafer 120 when the pre-determined number of energy errors 763 propagates through all or part of the lithography system 500. The pre-determined number of energy errors corresponds to the size of the slit 126 in the lithography system 500. The slit window is modeled in the model 700 as the slit filter model 774 (discussed below). The size of the slit determines the number of energy errors that propagate through the system 500. The number can be, for example, 41. In other words, the model 700 estimates the effect of a known energy error (the energy error 763) on dose error at the wafer 120.

Additionally, the model 700 allows the controller 554 to determine the initial control sequence 555 that, if applied to the optical source 205, would reduce the variance of the estimated dose error signal 751. In this way, the initial control sequence 555 is a series or sequence of inputs that, when provided to the optical source 205, counteract the effect of the presence of energy that is a known amount greater or less than the desired energy at the wafer 120.

As discussed in greater detail below, in the process 600, the initial control sequence 555 is scaled based on an energy error derived from the measured indication of energy 551 and the pre-determined energy error 763 to generate a scaled initial control sequence. The scaled initial control sequence is then added to the portion of the control sequence 552 yet to be applied to the optical source 205. The result is an updated control sequence 552. The first value from the updated control sequence 552 is applied to the optical source 205 and the process repeats. Thus, the process 600 combines the optimized initial control sequence 555 with the measured data to control the optical source 205 in a suitable manner that minimizes the dose error. Before returning to the process 600, the block diagram of the controller 554 shown in FIG. 7 and a process 800 for determining the initial control sequence 555 using the controller 554 are discussed.

The model 700 represents, for example, mathematically, the behavior of the some or all of the components of the optical source 205 and the lithography exposure apparatus 115 that interact with the light beam 560. In the example of FIG. 7, the model 700 includes a nonlinearity model 772 and a slit filter model 774. The nonlinearity model 772 is based on and represents the nonlinearities in the optical source 205. For example, the nonlinearity model 772 can be a representation of the graph 400 (FIG. 4), which relates the energy of a pulse produced by the optical source 205 to an amount of voltage applied to the electrodes 217. As shown in FIG. 4, the relationship between the energy of the pulse produced by the light source 205 and the voltage applied to the electrodes 217 is nonlinear.

The model 700 also includes the slit filter model 774, which represents the slit 126 and/or another aperture in the lithography apparatus 115. The optical beam 260 passes through apertures in the lithography exposure apparatus 115, including the slit 126. The slit 126 is one or more physical apertures formed in a material that does not otherwise pass the optical beam 260. The slit filter model 774 is a representation of the effect of slit 126 on the dose received by the wafer 160. The slit 126 filters the beam 560 by only passing a part of the beam 560 and by changing the intensity profile of the transmitted beam. The intensity change is brought about by the diffraction of light by the slit edges. The dose received by a small region on the wafer 160 can be represented by the convolution of the sequence of measured pulse energies of the beam 560 by the slit filter model 774. The slit 126 is characterized by its finite impulse response, f. The effect of the slit 126 on the energy of the beam 260 is modeled as the slit filter model 774, which may be a Finite Impulse Response (FIR) filter with a response, f, containing N terms.

Together, the nonlinearity model 772 and the slit filter model 774 describe the photolithography system 500 and can be used to predict the behavior of the system 500.

The controller 554 also includes cost function module 776 and a candidate control sequence module 778. The candidate control sequence module 778 provides candidate control sequences 779 to the cost function module 776. The cost function module 776 minimizes or reduces a cost function, J, which is a function of the estimated dose signal 751 and a candidate control sequence 779, to determine the initial control sequence 555.

The controller 554 also may include an electronic processor 758, which can be one or more electronic processors, and an electronic storage 759. The electronic storage 759 may store candidate control sequences and data that describe the slit filter model 774 and the nonlinearity model 772. In some implementations, the controller 554 does not include the electronic processor 758 and the electronic storage 759, and instead uses the electronic processor 558 and the electronic storage 559 of the control system 550 (FIG. 5).

Referring also to FIG. 8, the process 800 for determining the initial control sequence 555 from the controller 554 is shown. The process 800 is performed by one or more of the electronic processors 758 or 558.

The pre-determined energy error 763 is accessed (810). The pre-determined energy error 763 can be an energy error that is assumed or expected to occur during operation of the lithography system 500. The pre-determined energy error 763 can be a numerical value that is stored on the electronic storage 559 and/or the electronic storage 759, or the pre-determined energy error 763 can be input into the controller 554 through operator intervention or an automated process.

The estimated dose error signal 751 associated with the pre-determined energy error 763 is determined (820). The estimated dose error signal 751 is determined by applying the nonlinearity model 772 (which is associated with the optical source 205) and the slit filter model 774 (which is associated with the lithography exposure apparatus 115) to the pre-determined energy error 763. The estimated dose error signal 751 for a pulse of light includes N values, with N being an integer number that equals the sum of the number of terms used to represent the slit 126 and the number of terms in the candidate control sequence. The terms that define the filter of the slit filter model 774 are not necessarily equal in value and can be weighted.

An initial candidate control sequence 779 is determined from the candidate control sequence module 778 (830). The initial candidate control sequence has M values, with M being an integer number that represents the number of pulses to which the candidate control sequence is applied. The initial candidate control sequence can be any sequence of numerical values, with each value representing a value of an input that is applied to the optical source 205 (modeled as the nonlinearity model 772). For example, the initial candidate control sequence can be a vector of M values that are all zero. This would indicate that no inputs are applied to the optical source 205 or that the inputs that are applied to the optical source 205 have no effect on the energy produced by the optical source 205.

A value of an energy metric is determined (840). The value of the energy metric can be associated with a variation among the N values in the estimated dose error signal 751. The energy metric can be, for example, the sum of squares of the values in the estimated dose error signal 751. Other energy metrics are possible. For example, the estimated dose error signal 751 can include positive and negative values, and the energy metric can be the sum of squares of the absolute value of the estimated dose error signal 751. A value of a control metric is determined (850). The value of the control metric can be associated with a variation among the M values in the initial candidate control sequence. The control metric can be, for example, the sum of squares of the second ($2^{nd}$) derivative of the M values of the initial candidate control sequence.

An initial value of a cost metric is determined (860). The value of the cost metric is function J that includes the sum of the energy metric and the control metric. By minimizing the sum of the energy metric and the control metric, either or both of the energy metric and the control metric are reduced or minimized. The physical effect of a minimized energy metric is less error in the total amount of the energy that reaches the wafer 120 (FIG. 5) and therefore less dose error, leading to improved performance of the lithography system 500. A higher value for the control metric indicates that the amplitude of the input signal being provided to the optical source 205 is varying more between pulses. Reducing this variation reduces the chances of the optical source 205 and/or the lithography system 100 becoming unstable and also can improve system performance by not subjecting the optical source 205 to large swings in the input signal. The control metric provides a measure of how smoothly the control sequence applies an input to the optical source 205, with a lower value of the control metric indicating a smoother and more stable control.

An example of the cost function J is provided in Equation (1):

$$J(h) = \Sigma_{k=0}^{N-1} d^2(k) + Q\{h(0)^2 + [h(1)-h(0)]^2 + \Sigma_{k=2}^{M-1}[h(k)-2h(k-1)-h(k-2)]^2)\} \quad (1),$$

where k indexes the pulses of the modeled light beam, f is the finite impulse response of the slit 126, d is the estimated dose error signal 751 (the dose error signal resulting from the pre-determined error 763), h is the initial candidate control sequence, and Q is a numerical value that specifies how the smoothness of control (related to the control metric) and the variance of the dose error (related to the energy metric) are weighted. When Q is greater than one, the smoothness of control is weighted more than the variation in dose error, and when Q is less than one, the variation in dose error is more heavily weighted than the smoothness of control. Each of the N terms of the estimated dose error signal (d) 751 is determined from Equation (2):

$$d(n)=\Sigma_{k=0}^{N-1}f(k)h(n-k) \qquad (2),$$

where d(n) is the $n^{th}$ term of the estimated dose signal 721, k indexes the pulses of the modeled light beam, and f(k) is the finite impulse response of the slit 126. The nonlinearities and constraints of the optical system 505 can be incorporated into the determination of the estimated dose signal 721 and ultimately used to determine the initial control sequence 555. In these implementations, each of the N terms of the estimated dose signal (d) 751 is determined from Equation (3):

$$d(n)=\Sigma_{k=1}^{n-1}f(k)EVh(n-k) \qquad (3),$$

where EV is the nonlinear transfer function (input-output relationship) of the optical source 205 that is included in the nonlinear model 772.

The initial value ($J_o$) of the cost function J is determined using the energy metric (840), the control metric (850), and the value Q. As discussed above, the process 800 reduces or minimizes the value of the cost function J. The initial candidate control sequence $h_o$ is used to determine the initial value of the cost function J. The initial candidate control sequence can be adjusted with the candidate control sequence module 778. The candidate control sequence module 778 can apply a perturbation to the initial candidate control sequence to generate a new candidate control sequence, h'. The new candidate control sequence h' can be determined from the initial candidate control sequence according to Equation 4:

$$h'=h_o+X_{1\times M}\Delta \qquad (4),$$

where $h_o$ is the initial candidate control sequence, X is a random vector of values belonging to the set $\{-1,0, 1\}$, which is used to define the direction of the perturbation or to null the perturbation, and $\Delta$, which is a small value, for example, $10^{-4}$ or perturbation that defines the neighborhood region of possible control sequences.

The cost function (Equation 1) is computed using h' instead of $h_o$ (the initial candidate control sequence), and the results are compared to the initial value of the cost function ($J_o$). If the cost function using the new candidate control sequence is less than the initial value of the cost function ($J_o$), the new candidate control sequence is selected as the initial control sequence 555. The perturbation $\Delta$ is in M dimensions such that each value in the control sequence is perturbed until the cost function J is minimized. All of the possible perturbations in the space can be computed until the initial control sequence 555, which is the control sequence that results in the minimum value of the cost function J, is determined. In some implementations, the initial control sequence 555 can be determined within hundreds or thousands of iterations.

Returning to FIG. 6, a second control sequence is determined (640). The second control sequence is an instance of the control sequence 552 and is based on initial control sequence 555, the determined energy error 563, and value from a previous instance of the control sequence 552. The determined energy error 563 is the difference between the expected energy, which is the sum of the target energy 562 and one or more values from a previous instance of the control sequence 552, and the indication of measured energy 551, which is a measured value of the amount of energy at the wafer 120.

As discussed above, the control sequence 552 includes M values, with each value corresponding to a value that is applied to the optical source 205 to control the amount of energy in a particular pulse of light produced by the optical source 205. The control system 550 includes the buffer 557, which stores instances of the control sequence 552. The first value in the buffer 557 is the value of the stored instance of the control sequence 552 that is applied to the optical source 205 prior to generation of a pulse (for example, the pulse k). After the first value is applied to the optical source 205, the first value is deleted from the control sequence 552 and the values remaining in the stored control sequence 552 are shifted. The shift causes what was the second value in the control sequence 552 to become the first value. Thus, the buffer 557 can store values of previous instances of the control sequence 552.

To determine the second control sequence, the initial control sequence 555 is scaled by the determined energy error 563 to generate a scaled initial control sequence, H(k). As discussed above with respect to FIG. 8, the initial control sequence 555 is determined using a pre-determined or assumed energy error 763. The assumed energy error 763 may be different than the determined energy error 563, which is based on measured data. This difference can be accounted for by scaling the initial control sequence 555. The initial control sequence 555 is scaled to produce a scaled initial control sequence H(k) based on the determined energy error 563 as shown in Equation 5:

$$H(k)=he(k) \qquad (5),$$

where h is the initial control sequence 555 determined from the process 800, k indexes the pulses of the light beam 560, and e(k) is the determined energy error 563.

The scaled initial control sequence H(k) can be a vector that includes M values (the same number of values that is in the initial control sequence 555 and the control sequence 552). Each of the M values represents an input that is applied to the optical source 205 to produce a pulse of light. As discussed above, the second control sequence is determined from the initial control sequence 555, the determined energy error 563, and a value from a previous instance of the control sequence 552. The second control sequence to be applied to the optical source 205 can be determined as shown in Equation 6:

$$X(k+1)=TX(k)+H(k) \qquad (6),$$

where X(k+1) is the second control sequence, X(k) is a previous instance of the control sequence 552 (stored on the buffer 557), H(k) is the scaled initial control sequence determined in Equation (5), and T is a transfer function that operates on the previous instance of the control sequence X(k). The transfer function T can be any type of transfer function that operates on the arrangement of the values within the previous instance of the control sequence but does not change the values themselves. For example, the transfer function T can be a left-shift operator that shifts all of the values in the buffer 557 by a certain amount such that some of the values of the stored control sequence are removed from the buffer 557.

The second control sequence is determined in part from the control sequence 552 that was applied to the optical source 205 to produce the immediately preceding pulse. Thus, the second control sequence can be determined prior to each pulse that the optical source 205 generates, and the process 600 can provide pulse-to-pulse control of the optical source 205.

The second control sequence is applied to the optical source 205 (650). Each of the M values in the second control sequence can be a value of a voltage that is applied to the electrodes 217 to produce a pulse of an energy as determined by the second control sequence. Additionally, the control sequence 552 can be updated (or another instance of the control sequence 552 can be determined) as discussed in (640). A value of the updated control sequence can be applied to the optical source 205 immediately prior to the production of the $(k+1)^{th}$ pulse. The control sequence 552 can be updated again prior to the next light pulse (the $k+2^{nd}$ pulse in this example). In this way, the optical source 205 can be controlled on a pulse-to-pulse basis.

As discussed above, the second control sequence has M values. Thus, application of the second control sequence to the optical source 205 produces a pulse k+1 and also can govern the production of the subsequent sequential pulses (k+1) to (M−1) according to the second control sequence. In these implementations, the energy of the M pulses is determined by the control sequence 552, but the control sequence 552 is not necessarily updated prior to the production of each pulse.

Referring to FIG. 9, a block diagram of an example implementation of a control system 950 is shown. The control system 950 is used with the optical source 205, and the lithography exposure apparatus 115. The control system 950 is similar to the control system 550, except the control system 950 includes a controller 954, which includes a plurality of controllers 954A to 954N, and a selector module 957, which produces a selected control sequence 956. The controller 954 can include any number of controllers. Each of the controllers 954A to 954N is generated based on the process 800 discussed above using an assumed energy error value 963A to 963N, respectively. Each of the controllers 954A to 954N is associated with a cost function J (such as the cost function shown in Equation 1, discussed above). The controllers 954A to 954N vary from each other through the parameter Q, which, as discussed above with respect to Equation 1, is a numerical value that specifies the relative weighting of the smoothness of control and the variance of the dose error. In particular, the parameter Q has a different value for each of the controllers 954A to 954N. Larger values of the parameter Q indicate that the cost function weighs the smoothness of control more than the variance in dose error. In the example of FIG. 9, the controller 954A has the smallest value of Q of all the controllers 954A to 954N. The value of the parameter Q for each subsequent controller 954B to 954N is larger than the preceding controller, with the controller 954N having the largest value of Q of all of the controllers 954A to 954N. The different values of Q allow each of the controllers 954A to 954N to address a range of variations in energy fluctuations. In this way, the control system 950 can maintain the dose error to within expected limits and maintain stability of the control system 950 even in the presence wide variations in energy fluctuations.

Each of the controllers 954A to 954N produces an initial control sequence, according to the process 800. The controller 954 scales each of the initial control sequences by a determined energy error 963 according to the process discussed above at (640) of FIG. 6 to produce control sequences 952A to 952N, respectively. The determined energy error 963 is similar to the determined energy error 563 (FIG. 5). The determined energy error 963 is found from the indication 551, the target energy value 562, and a value from a previous instance of the selected control sequence 956. Instances of the selected control sequence 956 can be stored in the buffer 557 so that one or more values of a previous instance of the selected control sequence 956 can be used to determine a subsequent selected control sequence 956 for application to the optical source 205

The selector module 975 applies a control criteria to select one of the control sequences from among the control sequences 952A to 952N. The selected control sequence 956 is applied to the optical source 205.

Referring to FIG. 10, an example of a process 1000 for generating the selected control sequence 956 is shown. The process 1000 can be performed by the electronic processor 558 of the control system 950.

The indication 551 of an amount of energy in a pulse of light is received. The amount of energy is measured by the detector 122 and is the amount of energy received at the wafer 120 due to a single pulse of light being emitted from the optical source 205 and passing through the lithography exposure apparatus 115. The energy error 963 is determined from the received indication 551, the target energy value 562, and a previous instance of the selected control sequence 956 (1010).

Each of the plurality of initial control sequences is determined by the process 800 in a manner similar to determining the initial control sequence 555 (FIG. 5). A plurality of control sequences 952A to 952N are determined from the plurality of initial control sequences and the determined energy error 963. Each of the plurality of control sequences 952A to 952N is scaled by the determined energy error 963 as discussed at (640) and Equation 5 of the process 600 discussed with respect to FIG. 6. For example, a first control sequence 952A can be determined by applying the determined energy error 963 to the initial control sequence generated by the controller 954A (1020). Additionally, a previous instance of the selected control sequence 956 can be added to the scaled control sequences 952A to 952N.

The values of the first control sequence 952A can be compared to control limits (an upper value and a lower value). If all of the values in the first control sequence 952A are within the control limits, then the first control sequence 952A is selected as the selected control sequence 956 (1030). If any of the values in the first control sequence are outside of the control limits (either greater than the upper value or less than the lower value), then the process 1000 determines a second control sequence 952B by applying the determined energy error 963 to the initial control sequence generated by the controller 954B (1040). As discussed above, the cost function associated with the controller 954B has a larger Q value than the cost function associated with the controller 954A.

The values of the second control sequence 952B are compared to the control limits. If all of the values of the second control sequence 952B are within the control limits, the second control sequence 952B is selected as the selected control sequence 956 (1050). If any of the values in the second control sequence are outside of the control limits, then the process 1000 determines a third control sequence 952C by applying the determined energy error 963 to the initial control sequence generated by the controller 954C (1060). In the example shown in FIG. 10, the third control sequence 952 is selected as the control sequence 956 and the process 1000 ends (1070). However, in other implementations, more than three possible control sequences can be generated and compared to the control limits.

Other implementations are within the scope of the following claims.

What is claimed is:

1. A lithography system comprising:
an optical source configured to emit a pulsed light beam;
an optical lithography apparatus comprising an optical system, the optical system being positioned to receive the pulsed light beam from the optical source at a first side of the optical system and to emit the pulsed light beam at a second side of the optical system; and
a control system coupled to the optical source and the optical lithography apparatus, the control system configured to:
receive an indication of an amount of energy in the pulsed light beam at the second side of the optical system,
determine an energy error, the energy error being based on the received indication of the amount of energy,
access an initial control sequence, the initial control sequence being associated with the lithography system and being configured to correct for an assumed energy error of the lithography system,
determine a second control sequence based on the determined energy error and the initial control sequence, and
apply the second control sequence to the optical source.

2. The lithography system of claim 1, wherein the control system is further configured to access a target energy and a previous control sequence.

3. The lithography system of claim 2, wherein the control system being configured to determine an energy error comprises the control system being configured to determine the energy error from the received indication of the amount of energy and an expected energy, the expected energy being based on the accessed target energy and at least one value from the previous control sequence.

4. The lithography system of claim 3, wherein the previous control sequence comprises a control sequence that was applied to the optical source prior to the determination of the second control sequence.

5. The lithography system of claim 3, wherein the previous control sequence comprises at least one predetermined value that was not applied to the optical source prior to the determination of the second control sequence.

6. The lithography system of claim 2, wherein the target energy is an energy in the pulsed light beam at the second side of the optical system when no disturbances are present in the optical source or the optical system.

7. The lithography system of claim 1, wherein the optical source comprises a laser.

8. The lithography system of claim 1, wherein the optical source comprises a two-stage laser system, the two-stage laser system comprising a master oscillator and a power amplifier.

9. The lithography system of claim 1, wherein the control system comprises one or more electronic processors, and a non-transitory, computer-readable storage medium coupled to one or more of the one or more electronic processors, the computer-readable storage medium having stored thereon instructions, which, when executed by the one or more electronic processors, causes the one or more processors to perform operations.

10. The lithography system of claim 1, wherein:
the optical source comprises discharge electrodes,
the second control sequence comprises at least one value representing a voltage, and
the control system being configured to apply the second control sequence to the optical source comprises the control system being configured to apply the at least one value representing a voltage to the discharge electrodes.

11. The lithography system of claim 1, wherein the second control sequence comprises a plurality of values, and the initial control sequence comprises a control sequence that minimizes a cost function, the cost function depending on either or both of (a) a variation of an integrated amount of energy at the second side of the optical system and (b) a variation of the values of the second control sequence.

12. The lithography system of claim 1, wherein the assumed energy error of the lithography system comprises a modeled energy error, and determining the modeled energy error comprises:
providing a known amount of energy as an input to a system model, the system model being configured to predict the behavior of the optical source and the lithography apparatus, and the system model comprising:
a non-linearity model configured to relate an optical output of the optical source to an excitation of the optical source, and
a slit filter model configured to relate an amount of energy at a second side of the optical system to a transmission characteristic of an aperture in the optical system; and
obtaining an output of the system model to determine the modeled energy error.

13. The lithography system of claim 1, wherein the initial control sequence being associated with the lithography system comprises the initial control sequence being associated with the optical source of the lithography system.

14. A method comprising:
receiving an indication of an amount of energy in a pulsed light beam at a second side of an optical system, the pulsed light beam being produced by an optical source on a first side of the optical system;
determining an energy error, the energy error being based on the received indication of the amount of energy;
determining a second control sequence based on the determined energy error and an initial control sequence, the initial control sequence being associated with a lithography system that comprises the optical source, the initial control sequence being a control sequence configured to correct for an assumed energy error of the lithography system; and
applying the second control sequence to the optical source.

15. The method of claim 14, wherein determining an energy error based on the received indication of the amount of energy comprises determining the energy error from the received indication of the amount of energy and an expected energy, the expected energy being based on a target energy and at least one value from a previous control sequence.

16. The method of claim 15, wherein the previous control sequence comprises a control sequence applied to the optical source prior to determining the second control sequence.

17. The method of claim 16, wherein applying the second control sequence to the optical source reduces one or more of a dose error and a control metric, the dose error being based on a difference between the target energy and the received indication of the amount of energy and the control metric being based on a variation of values in a control sequence applied to the optical source.

18. The method of claim 17, wherein the second control sequence is applied to the optical source prior to the optical source producing a first pulse, and the third control sequence is applied to the optical source prior to the optical source producing a second pulse, the first and second pulses being any two sequential pulses of the pulsed light beam.

19. The method of claim 17, wherein applying the second control sequence to the optical source reduces the control metric.

20. The method of claim 15, wherein the previous control sequence comprises at least one predetermined value that was not applied to the optical source prior to the determination of the second control sequence.

21. The method of claim 15, wherein applying the second control sequence to the optical source reduces a dose error, the dose error being based on a difference between the target energy and the received indication of the amount of energy.

22. The method of claim 14, further comprising:
accessing a second indication of an amount of energy at the second side of the optical system;
determining a second energy error based on the second indication of the amount of energy and an expected energy, the expected energy comprising at least one value of the second control sequence and a target energy;
determining a third control sequence based on the determined second energy error and an initial control sequence; and
applying the third control sequence to the optical source.

23. The method of claim 14, further comprising determining the initial control sequence, wherein determining the initial control sequence comprises:
accessing a model associated with the optical source;
determining a modeled dose error based on the accessed model, the modeled dose error comprising N values;
determining a candidate control sequence, the candidate control sequence comprising M values;
determining a value of an energy metric, the value of the energy metric being associated with a variation of the N values of the modeled dose error;
determining a value of a control metric, the value of the control metric being associated with a variation of the M values of the candidate control sequence; and
determining an initial value of a cost metric, the cost metric being based on the value of the value of the energy metric and the value of the control metric.

24. A lithography system comprising:
an optical source configured to emit a pulsed light beam comprising a plurality of pulses of light;
an optical lithography apparatus comprising an optical system, the optical system being positioned to receive the pulsed light beam from the optical source at a first side of the optical system and to emit the pulsed light beam at a second side of the optical system; and
a control system coupled to the optical source and the optical lithography apparatus, the control system comprising:
a plurality of controllers, each controller associated with a sequence of gain values, a lower limit value, and an upper limit value; and
one or more electronic processors and a non-transitory, computer-readable storage medium coupled to the one or more electronic processors, the computer-readable storage medium having stored thereon instructions, which, when executed by the one or more electronic processors, causes the one or more processors to:
receive an indication of an amount of energy in a subset of pulses of the pulsed light beam at the second side of the optical system,
determine an energy error based on the received indication of the amount of energy in the subset of pulses,
determine an energy metric related to the determined energy error,
access a previously generated control sequence stored in the computer-readable storage medium,
generate a plurality of control sequences related to the determined energy error and a sequence of gain values associated with each controller from the plurality of controllers and the accessed previously generated control sequence, each control sequence of the generated plurality of control sequences comprising one or more values that are configured to control one or more aspects of the optical source to control an amount of energy in one or more pulses of light emitted from the optical source,
select a control sequence from the generated plurality of control sequences by comparing each control sequence to the upper limit value and the lower limit value, and
apply the selected control sequence to the optical source to reduce the energy metric.

25. The lithography system of claim 24, further comprising a wafer holder configured to receive a wafer positioned on the second side of the optical system, wherein the received indication of the amount of energy in the pulses of the pulsed light beam at the second side of the optical system comprises an indication of the amount of energy in the pulses of the pulsed light beam at the wafer holder.

26. A method of controlling an optical lithography system, the method comprising:
receiving an indication of an amount of energy in a plurality of pulses of light, the plurality of pulses of light being a subset of pulses in a pulsed light beam emitted from an optical source;
determining an energy metric based on the received indication, the energy metric representing a measured amount of energy in the subset of pulses;
comparing the determined energy metric to a reference energy value;
determining an energy error based on the comparison;
determining a plurality of control sequences from the energy error, each of the plurality of control sequences being determined based on a gain value and the energy error;
comparing the determined control sequences to a control limit; and
selecting a control sequence that is within the control limit from among the determined plurality of control sequences.

27. The method of claim 26, wherein the control limit comprises a plurality of control limits.

28. The method of claim 27, wherein each of the determined control sequences are compared to one of the plurality of control limits.

29. The method of claim 26, wherein the selected control sequence comprises a plurality of values, applying the selected control sequence to the optical lithography system comprises providing the plurality of values to an optical source of the optical lithography system, the values being configured to control one or more electrodes in the optical source, and controlling the one or more electrodes controls an amount of energy output in a pulse of light produced by the optical source.

30. A method comprising:
accessing an energy error, the energy error being a predicted energy error associated with an optical source;
accessing a model of the optical source, the model of the optical source relating an energy of a pulse of light produced by the optical source to an input to the optical source;
determining an estimated dose error based on the accessed energy error and the model of the optical source, the estimated dose error comprising a plurality of values;
accessing first candidate control sequence, the first candidate control sequence comprising a plurality of values;
determining a value of an energy metric based on the values of the estimated dose error;
determining a first value of a control metric based on the values of the first candidate control sequence;
determining a first value of a cost metric based on the value of the energy metric and the first value of the control metric;
accessing a second candidate control sequence, the second candidate control sequence comprising a plurality of values;
determining a second value of the control metric based on the values of the second candidate control sequence;
determining a second value of the cost metric based on the energy metric and the second value of the control metric;
selecting the second candidate control sequence as a selected control sequence if the second value of the cost metric is less than the first value of the cost metric; and
selecting the first candidate control sequence as the selected control sequence if the second value of the cost metric is equal to or greater than the first value of the cost metric.

31. The method of claim 30, further comprising: accessing a weighting factor, and wherein determining the first value of the cost metric and the second value of the cost metric is further based on the weighting factor.

32. The method of claim 31, wherein:
the first value of the cost metric is based on the weighting factor, and a sum of the first value of the control metric and the energy metric, and
the second value of the cost metric is based on the weighting factor, and a sum of the second value of the control metric and the energy metric.

33. The method of claim 30, further comprising applying the selected control sequence to the optical source.

34. The method of claim 30, wherein the model of the optical source relating an energy of a pulse of light produced by the optical source to an input of the optical source comprises a non-linear relationship between the energy and the inpu

* * * * *